(12) United States Patent
Loeffler (10) Patent No.: US 7,737,750 B2
(45) Date of Patent: Jun. 15, 2010

(54) METHOD AND DEVICE FOR DETERMINING TRIM SOLUTION

(75) Inventor: Steffen Loeffler, Essex, VT (US)

(73) Assignee: Infineon Technologies AG, Neubiberg (DE)

( * ) Notice: Subject to any disclaimer, the term of this patent is extended or adjusted under 35 U.S.C. 154(b) by 754 days.

(21) Appl. No.: 11/653,312

(22) Filed: Jan. 16, 2007

(65) Prior Publication Data

US 2008/0169854 A1    Jul. 17, 2008

(51) Int. Cl.
  *H03L 7/06*    (2006.01)
(52) U.S. Cl. .................. 327/279; 327/160; 327/265
(58) Field of Classification Search .................. 327/160
  See application file for complete search history.

(56) References Cited

U.S. PATENT DOCUMENTS

| | | | | |
|---|---|---|---|---|
| 5,532,632 A | * | 7/1996 | Kent | 327/141 |
| 6,169,436 B1 | * | 1/2001 | Marbot | 327/270 |
| 7,116,148 B2 | * | 10/2006 | Minzoni | 327/158 |
| 7,308,372 B2 | * | 12/2007 | Rifani et al. | 702/69 |

* cited by examiner

*Primary Examiner*—Lincoln Donovan
*Assistant Examiner*—Terry L Englund
(74) *Attorney, Agent, or Firm*—Dicke, Billig & Czaja, PLLC (57) ABSTRACT

A trimming system for determining a trim solution for a semiconductor device includes an internal value generating circuit for generating an internal value based upon a counter value. The relationship between the internal delay value and an external reference is compared to determine if the counter value is a possible trim solution, while predetermined counter values are excluded as a trim solution.

26 Claims, 7 Drawing Sheets

METHOD AND DEVICE FOR DETERMINING TRIM SOLUTION

BACKGROUND OF THE INVENTION

It is desirable to be able to adjust the performance of semiconductor integrated circuits after processing has been completed to minimize variations associated with process tolerances.

For example, in many semiconductor devices minimum timing requirements need to be maintained for proper operation. These timing requirements are generally based on an external clock or on internal delay elements.

Even when the timing requirements can be accurately modeled in simulation, it will differ from chip to chip due to process differences and will also differ over the temperature and voltage range allowed by the specification. The optimization of yield and performance of such devices requires a chip by chip adjustment of the delay circuits. However, optimization should be performed in a production environment that tests a multitude of chips in parallel in order to reduce test time and cost.

SUMMARY OF THE INVENTION

A trimming device that can include generating an internal value based upon a counter value, and comparing a relationship between the internal value and an external reference to determine if the counter value is the trim solution, where predetermined counter values are excluded as the trim solution.

BRIEF DESCRIPTION OF THE DRAWINGS

The accompanying figures, where like reference numerals refer to identical or functionally similar elements and which together with a detailed description set forth herein are incorporated in and form part of the specification, serve to further illustrate various exemplary embodiments and to explain various principles and advantages in accordance with this application.

DETAILED DESCRIPTION OF THE PREFERRED EMBODIMENTS

The following exemplary embodiments and aspects thereof are described and illustrated in conjunction with structures and methods that are meant to be exemplary and illustrative, and not limiting in scope. In the following description, numerous specific details are set forth to provide a thorough understanding of the embodiments described in this application. However, it will be obvious to those skilled in the art that the embodiments described in this application can be practiced without such specific, but exemplary, details. In other embodiments, circuits have been shown in block diagram form in order not to obscure the embodiments described in this application in unnecessary detail. For the most part, details have been omitted inasmuch as such details are not necessary to obtain a complete understanding of the embodiments described in this application.

Semiconductor devices such as semiconductor memory operate with minimum timing requirements so that data can be successfully read from and written to the memory array. For example, dynamic random access memory (DRAM) devices can use programmable delay elements, which can be used to adjust timings to determine an average value that can be used for all devices. This approach can require a high degree of guard band (a delay larger than the minimum requirement) to meet minimum delay requirements throughout the PVT (process/voltage/temperature) range, thereby limiting the performance of the device.

This situation can be improved by using a regulated power supply for the delay elements that diminishes voltage/temperature dependency by adjusting the power supply voltage so that the delay remains virtually constant. A further improvement can be made by implementation of a device to adjust the internal delay to an externally provided reference delay. The internally determined optimum setting can be read out by a test system and fed into a fuse converter to permanently store this solution in the device.

Delay circuits can be coded in a binary fashion. For example, a six bit register can be used to add binary coded delay elements, thereby allowing a trim solution range of 64 delay units in a time resolution of 1 unit delay. In an ideal solution, the delay achieved should have a completely linear relationship with the settings of the binary coded delay units. However, in actual practice, the real application is typically distorted due to process and device variations. For example, discontinuities can predominantly appear at the switch points between large delays based on, for example, most significant bit position changes.

These discontinuities can result in a larger than expected resolution (less accuracy) when trimming the delay to a desired target value (coarse trimming). This problem can be partially solved by implementing delay elements that result in overlapping delay ranges along the lines shown in FIG. 1. In this scenario, an optimum trim solution can be determined during pre-fuse tests and this solution will then be programmed into the chip by programming the correct fuses.

Test procedures for backend tests include a guard band test to account for inaccuracies in either test or application systems (fine trimming). These tests can be normally run on a system that tests many chips in parallel. To implement a guard band test for the internal timers, it is usually preferable to program all chips in parallel to a more critical time setting. This cannot be done without knowing the fuse solution of the course trimming. Further, a simple counter decrement command does not always create a more critical timing, since a smaller bit setting does not necessarily translate into a smaller delay value. That is, referring to the situation shown in FIG. 1, if a counter is decremented, for example, from 16 to 15, a corresponding decrease by one unit of delay is not achieved. Rather, an increase of six units of delay occurs.

Figure 2:
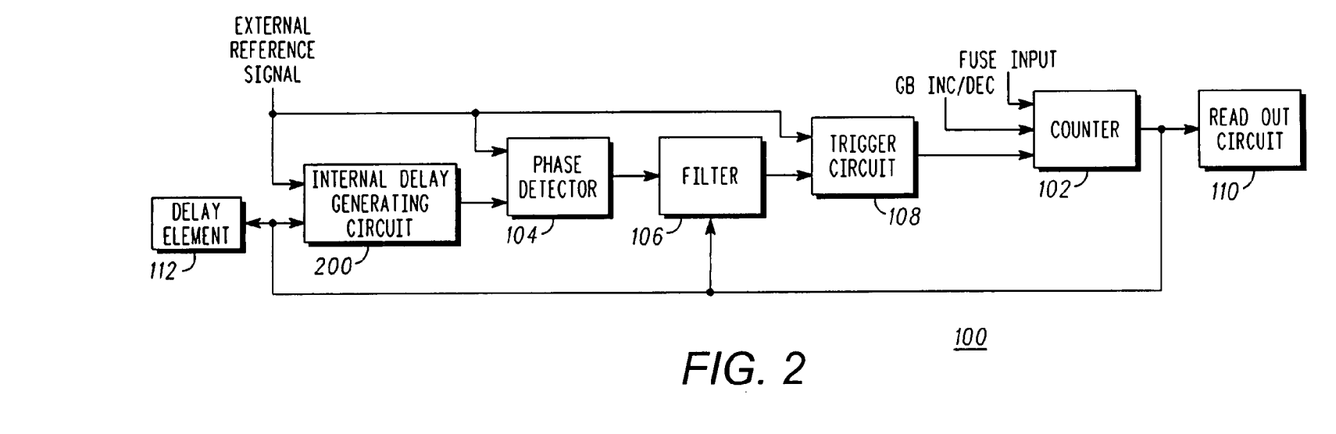
FIG. 2 is a block diagram of an exemplary trimming circuit for obtaining a trim solution for a chip.
Figure 3:
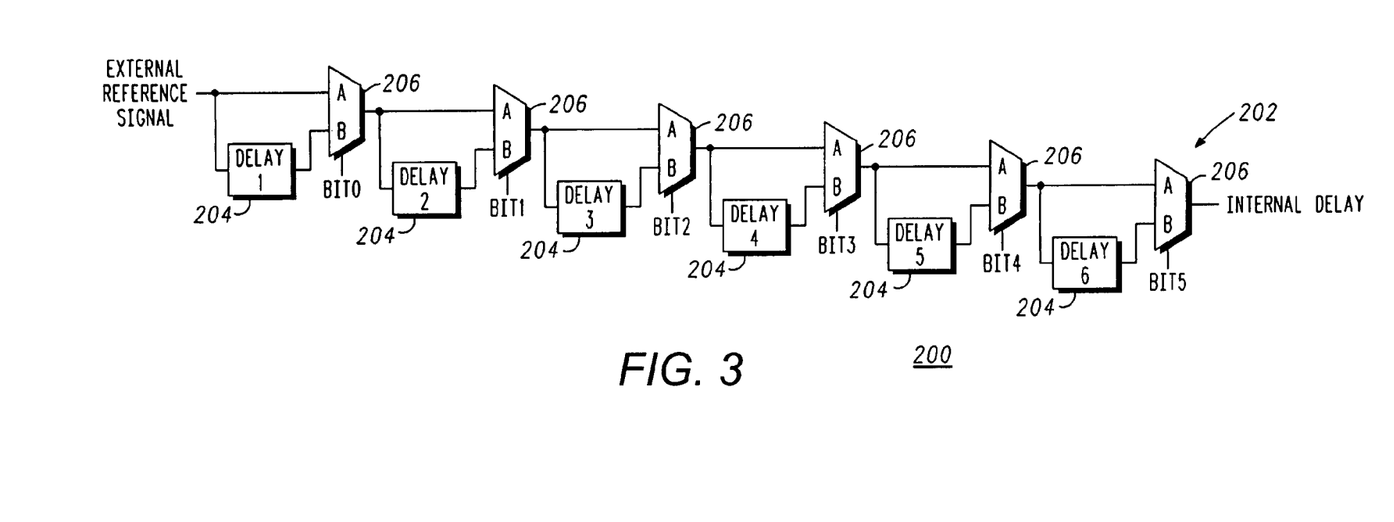
FIG. 3 is a circuit-level diagram of an exemplary internal value generating circuit in the trimming circuit of FIG. 2.

FIGS. 2 and 3 illustrate embodiments of a trimming circuit 100 for determining a trim solution. According to one embodiment, the trimming circuit 100 includes an internal value generating circuit 200, which is shown in detail in FIG. 3. The internal value generating circuit 200 (hereafter "delay circuit") generates an internal delay value or other internal value based upon a counter value of a counter 102.

The delay circuit 200 can be a copy of the delay element 112 used to generate delay during normal chip operation. Alternatively, the delay circuit 200 and the delay element 112 could be embodied in one circuit. The delay circuit 200 includes a delay chain 202 for generating one or more internal delay values based upon one or more counter values of the counter 102, respectively. For example, the delay chain 202 can include a predetermined number of sequentially connected delay units 204. Each of the predetermined number of sequentially connected delay units 204 has a particular delay value (i.e., delay 1-delay N). The delay chain 202 also includes a corresponding predetermined number of multiplexers 206. The predetermined number of delay units 204 and multiplexers 206 correspond to the number of bits used by the counter 102 to thereby apply a delay range. For example, in this example, six bits are used to provide 64 different counter values. Therefore, the delay chain 202 includes six delay units 204 and six multiplexers 206. The delay chain 202 receives an initial input signal that can be an external reference signal.

The counter 102 can output a predetermined number of signals that are a binary representation of the counter value. The signals are respectively connected to the predetermined number of multiplexers 206, which are respectively connected to the sequentially connected delay units 204. That is, the counter value from the counter 102 is applied as a predetermined bit value (six in one embodiment). Each of the six bits is respectively applied to one of the six multiplexers 206. Depending on the value of each of the six bits of the counter value, the external reference signal will be delayed by the value of a delay unit 204. For example, if only bit 0 of the counter value is high, while the remaining five bits (bit 1-bit 5) are low, the external reference signal would be delayed by only the first delay element (connected to counter bit 0). Generally, the delay of an internal signal can be equal to the sum of each delay unit that is activated by the counter value. In other words, the internal value is equal to a sum of the delay of the external reference signal after passing through the sequentially connected delay units 204.

The counter 102 can begin from a low value (i.e., 1) that sequentially increases one counter value in response to a signal from a trigger circuit 108. Alternatively, the counter 102 can begin from a high value (i.e., 63) that sequentially decreases one counter value in response to a signal from the trigger circuit 108. The counter 102 and trigger circuit 108 together can provide an adjusting means or an adjusting that sequentially increments or decrements the counter value.

As will be discussed more fully later, the delay times of the delay units 204 can be assigned so that the counter value is associated with the delay times by a non-binary relationship, such as that shown in FIG. 1. That is, the delay times can be assigned so that the internal delay value generated has a non-binary relationship with the counter value.

Returning to FIG. 2, according to one embodiment, the trimming circuit 100 can further includes a phase detector 104, a filter 106 and the trigger circuit 108, as well as the counter 102. The phase detector 104 compares a relationship between the internally generated value (i.e., delay value) and a parameter of an external reference signal to determine if the counter value is a possible chip trim solution. The parameter of the external reference signal is, for example, a pulse width of the external reference signal.

The phase detector 104 generates a signal indicative of the relationship between the external reference signal and the internal value generated by delay circuit 200. As mentioned above, an external reference signal can be delayed after having passed through the sequentially connected delay units 204, thereby providing the internally generated delay signal. In the event the counter 102 begins at a low value and is sequentially increased, the rising edge of the internally generated delay signal will be delayed by the delay circuit (initially set to the shortest delay). In the event the counter 102 begins at a high value and is sequentially decreased, the rising edge of the internally generated delay signal will be delayed by the delay circuit (initially set to the longest delay). The phase detector 104 compares the falling edge of the external reference signal with the rising edge of the internally generated delay signal. The rising and falling edges of the signals and the comparison thereof can be modified or changed based on the electrical devices used as understood by those skilled in the art.

Figure 4:
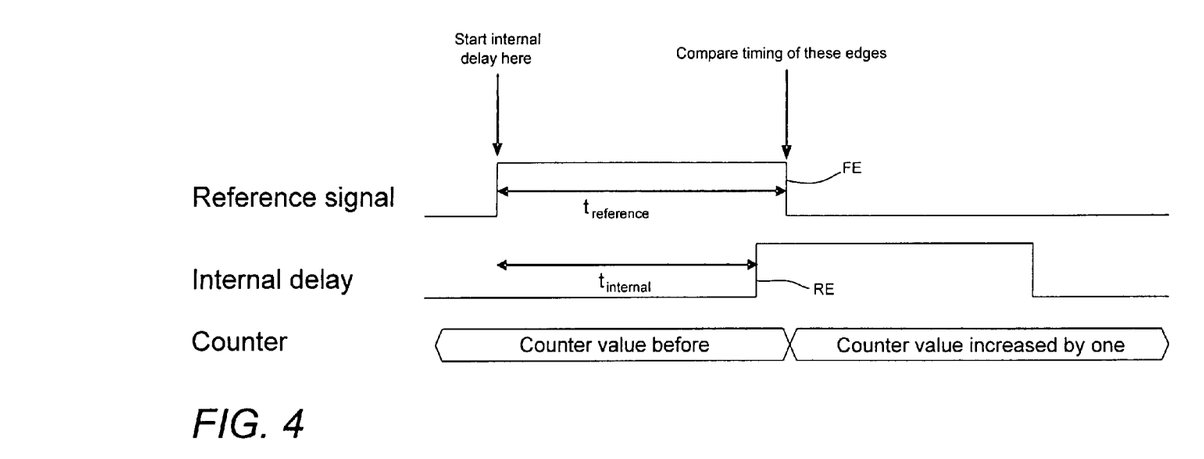
FIGS. 4 and 5 are timing diagrams for a phase detector for determining trim solutions in accordance with an embodiment of this application.
Figure 5:
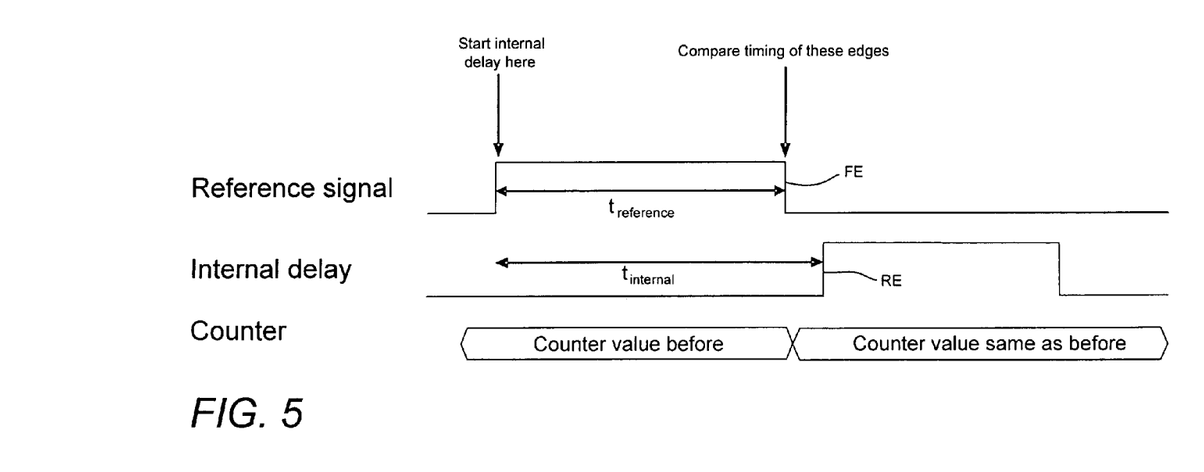

The phase detector 104 can be embodied by, for example, a D flip-flop, in which a falling edge on the clock input C will latch in the current state of the input D and propagate this to the output Q. The clock input C can correspond to an external reference signal (t-reference), and the input D can correspond to the internal delay (t-internal), as shown in FIGS. 4 and 5. The t-internal signal can be generated by the delay circuit 204. The counter 102 can begin at a low value and be sequentially increased when appropriate. In the situation where the rising edge (RE) of the generated internal delay (t-internal) occurs before the falling edge (FE) of the external reference value (t-reference) as shown in FIG. 4, the value of Q is 0 (low value). This indicates that there is no match, and the counter should be incremented. On the other hand, in the situation where the rising edge (RE) of the generated internal delay (t-internal) occurs after the falling edge (FE) of the external reference value (t-reference) as shown in FIG. 5, the value of Q is 1 (high value). A Q value of 1 (high-value) indicates a match was found, and the counter value is reported as the trim solution and the counter value is not increased further. In these comparisons, the high phase of the external reference signal should be long enough to allow the evaluation and increase the counter value of the counter 102, if necessary.

In the event the counter 102 begins at a low value and is sequentially increased and the parameter is the pulse width of the external reference signal, the phase detector 104 outputs a signal indicative of a match (possible trim solution) if the internal value is greater than or equal to the pulse width of the external reference signal. In the event the counter 102 begins at a high value and is sequentially decreased, the D flip-flop and associated circuitry can be modified as understood by those skilled in the art, if desired, such as by adding an inverter(s) at appropriate locations in the circuit. In the decreasing counter situation, the parameter is the pulse width of the external reference signal, the phase detector 104 can output a signal indicative of a match (possible trim solution) if the internal value is less than or equal to the pulse width of the external reference signal. On the other hand, no match is found if the internal value is greater than the pulse width of the external reference signal, and the counter is decreased.

Many embodiments and aspects thereof of the application are described and illustrated in conjunction with the use of an incrementing counter 102 or the incrementing of the counter to obtain the chip trim solution. These embodiments are meant to be exemplary and illustrative, and not limiting in scope. A decrementing counter 102 or the decrementing of the counter can also be used in embodiments of this application to obtain the chip trim solution, as discussed above. Alternatively, a counter that both increments and decrements can be used in the embodiments of this application, and is especially useful for fine trimming, including guard band testing. In the following description, the incrementing counter 102 or the incrementing of the counter to obtain the chip trim solution will be typically discussed in order not to obscure the embodiments described in this application in unnecessary detail. However, it will be understood by those skilled in the art that a decrementing counter 102 or the decrementing of the counter can also be used in the embodiments of this application to obtain the chip trim solution.

The filter 106 masks predetermined counter values to make a relationship between internal values generated by the delay circuit 200 and non-masked counter values have more linearity, when compared to a relationship between internal values generated by the delay circuit 200 and all counter values. That is, the filter 106 provides a range of linearity between counter values and generated internal values as long as the counter values are within a predetermined number of linear steps from the chip trim solution. Viewing FIG. 1, an acceptable trim solution includes counter setting 12, which permits three linear steps upward to counter value 15 before a point of discontinuity is reached between counter values 15 and 16, as well as more than three linear steps downward before any point of discontinuity is reached. Another acceptable trim solution is counter setting 19, which permits three linear steps downward to counter value 16 before a point of discontinuity is reached between counter values 15 and 16, as well as more than three linear steps upward before any point of discontinuity is reached.

Figure 6:
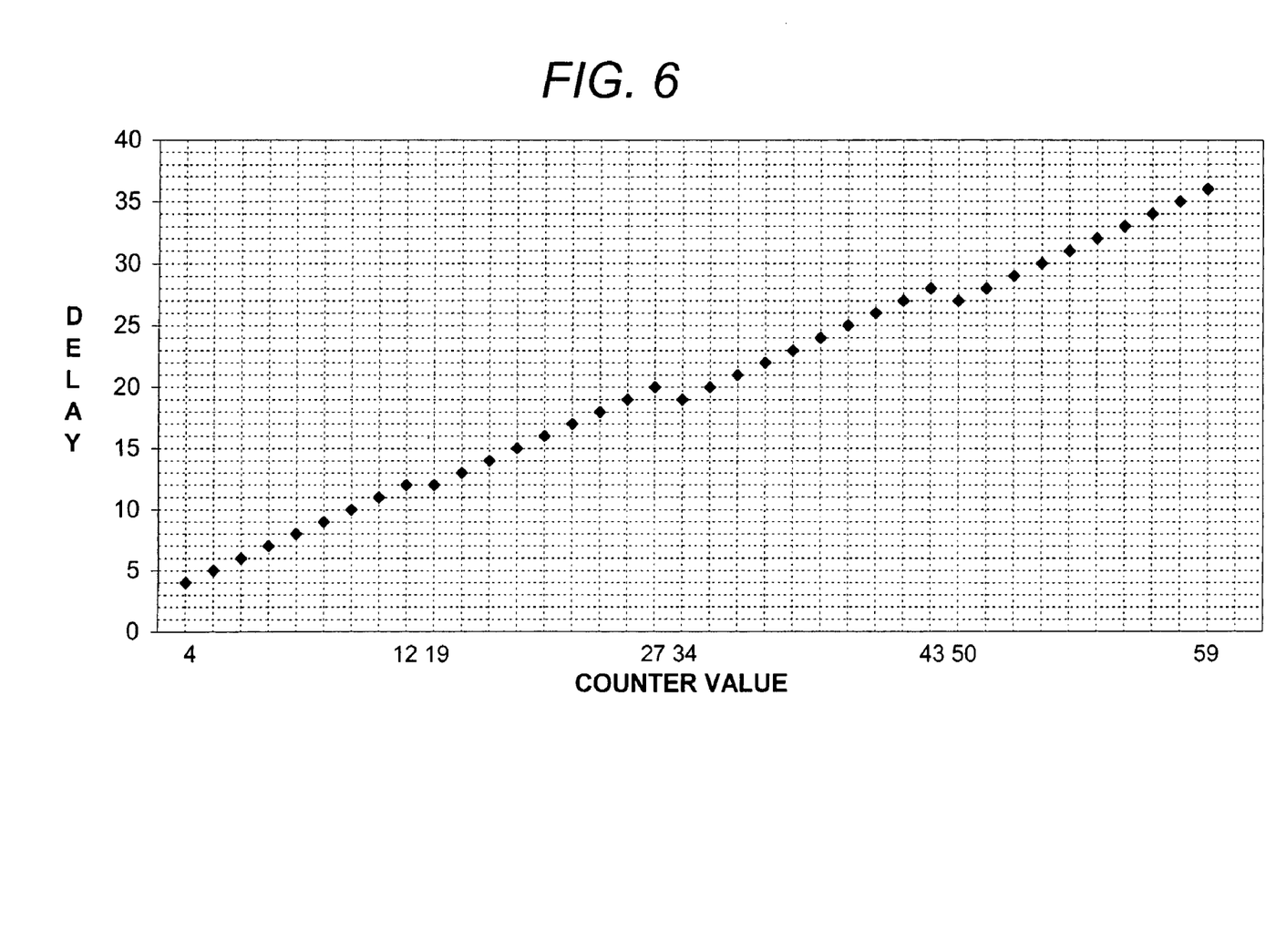
FIG. 6 is a graph of acceptable trim solutions in accordance with an embodiment of this application.

FIG. 6 shows an embodiment of a substantially linear relationship between the non-masked counter values and the generated internal values based thereon. The expression "substantially linear relationship" as used in this application can include the relationship between the non-masked counter values and the generated internal values based thereon, as shown in FIG. 6. As mentioned above, FIG. 1 shows a relationship between all counter values and the generated internal values based thereon. The counter values and related generated internal values shown in FIG. 1 correspond with those shown in FIG. 7. The relationship between internal values generated by the internal value generating circuit and non-masked counter values, as shown in FIG. 6, has more linearity when compared to a relationship between internal values generated by the internal value generating circuit and all counter values, as shown in FIG. 1.

Figure 1:
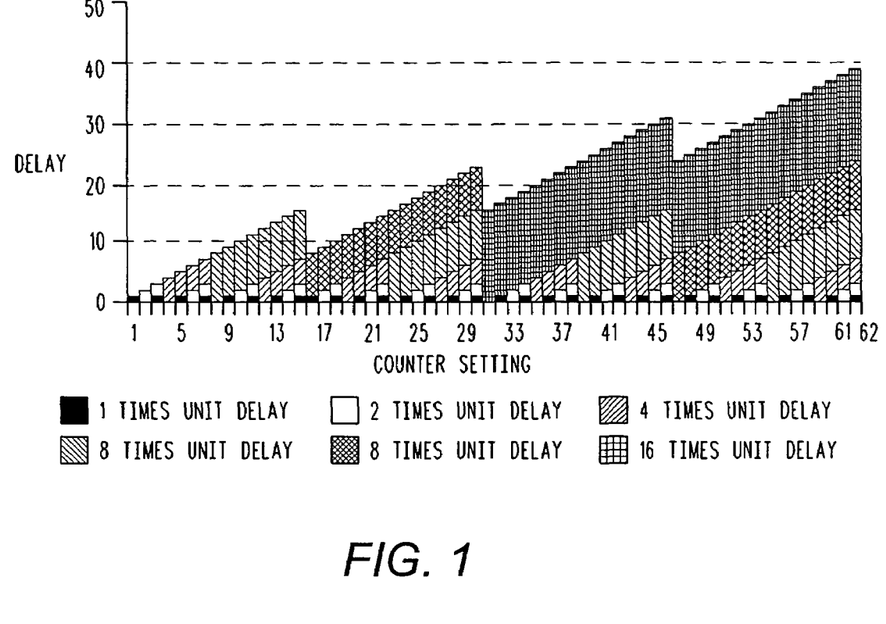
FIG. 1 is an illustration of the relationship between a non-binary delay and the counter settings.
Figure 7:
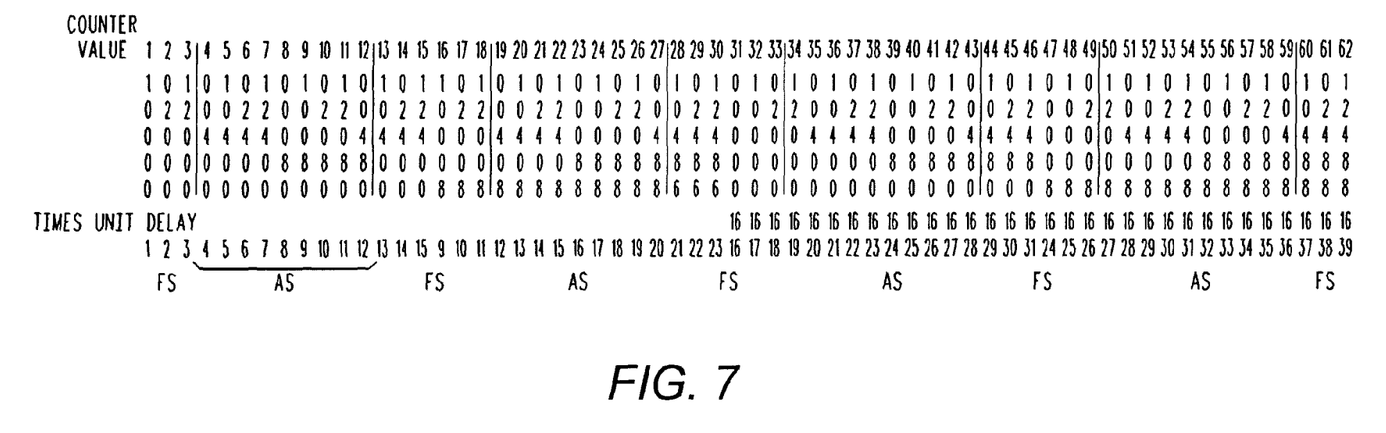
FIG. 7 is an illustration of exemplary forbidden and permissible trim solution ranges used during course trimming to obtain the trim solution.

In the relationships shown in FIGS. 1 and 7, there are points of discontinuity where adjoining counter values have significantly different generated internal values. The points of discontinuity include the relationship between counter values 15 and 16 where the corresponding generated internal values are 15 and 9 respectively. Other points of discontinuity include the relationship between counter values 30 and 31, as well as counter values 46 and 47. Viewing FIG. 1 from counter value 0 to counter value 62 (from left to right in FIG. 1), prior to counter value 15 (corresponding to internal value 15), the increase in the internal value is directly proportional to the increase in the counter value (i.e., 1 to 1). This is a perfectly linear relationship. After counter value 16 (corresponding to internal value 9), the increase in the internal value is also directly proportional to the increase in the counter value (i.e., 1 to 1) until the next point of discontinuity, which is between counter values 30 and 31. However, from counter value 15 to counter value 16, the generated internal value decreases from 15 to 9, which is a decrease of six delay units.

On the other hand, viewing FIG. 1 from a high counter value of 62 to a low counter value of 1 (from right to left in FIG. 1), the generated internal value increases six delay units from 15 to 9 from counter value 16 to counter value 15. The relationship of the generated internal value (delay units) for other points of discontinuity, such as between counter values 30 and 31 and between counter values 46 and 47 is similar.

In FIG. 1, the line of the generated internal values can begin from a low counter value of 0 to a high counter value of 62 (left to right), which is associated with incrementing the counter 102. Alternatively, the line of the generated values can begin from the highest counter value 62 to the lowest counter value 0 (right to left), which is associated with decrementing the counter 102. A "point of discontinuity" or "discontinuous point," as used in an embodiment of this application, can be defined as a turning point between adjoining counter values along a slope of a line between a starting counter value and an ending counter value where the generated internal value changes between negative and positive. A "point of discontinuity" or "discontinuous point," also as used in an embodiment of this application, can be defined as a turning point between adjoining counter values along a slope of a line between a starting counter value and an ending counter value where the generated internal value changes between negative and positive in an amount of more than one unit (i.e. one delay unit).

An embodiment of this application is directed to removing points of discontinuity (discontinuous points) for the generated internal value. By removing points of discontinuity, a more linear relationship can be established between the counter values and the generated internal values based thereon. The filter 106 masks or filters out predetermined counter values adjacent to points of discontinuity, thereby providing a "substantially linear relationship" between internal values, such as those generated by the delay circuit 200, and non-masked counter values. For example, the "substantially linear relationship" shown in FIG. 6 does include "points of discontinuity" as described above. In other words, the "substantially linear relationship" shown in and defined by FIG. 6 does not include a turning point between adjoining counter values along a slope of a line between a starting counter value (i.e., 0) and an ending counter value (i.e., 62) where the generated internal value changes between negative and positive. In addition, the "substantially linear relationship" shown in and defined by FIG. 6 does not include a turning point between adjoining counter values along a slope of a line between a starting counter value and an ending counter value where the generated internal value changes between negative and positive more than one unit (i.e. one delay unit). In other words, the "substantially linear relationship" shown in and defined by FIG. 6 includes a line between a starting counter value and an ending counter value that has a slope of where the generated internal value changes between negative and positive in an amount of no more than two units (i.e. two delay units).

If a match signal is received from the phase detector 104, the filter masks the counter value if it is within one of the ranges of predetermined forbidden chip trim solutions to thereby prevent it from being a possible chip trim solution. As a result, counter values can be incremented or decremented within a predetermined number of linear steps from the chip trim solution and have a substantially linear relationship with the internal values generated based thereupon, during fine trimming.

For example, as shown in FIG. 7, the filter 106 prevents counter values within forbidden solution ranges (FS) from becoming a possible chip trim solution. In FIG. 7, forbidden solutions are designated by the grouping FS, while acceptable solutions are designated by the grouping AS. The groupings FS and AS are separated by vertical lines in FIG. 7. The filter 106 can have a feedback connection with the output of the counter 102 to obtain the counter value. In one embodiment described, if a counter value is outside of the forbidden solution ranges (in one of the AS ranges) and the generated internal delay value is greater than or equal to the parameter of the external reference delay, then a valid match signal is sent to the trigger circuit 108. The trigger circuit 108 saves the corresponding counter value as the chip trim solution.

The forbidden solution ranges are determined based upon a predetermined number of linear steps desired for applying the guard band to the chip trim solution during fine trimming. A linear step refers to an increase or decrease in one direction of the chip trim solution to a new counter value that has a corresponding internal value that respectively increases or decreases in the same direction by only a single resolution unit. For example, referring to FIG. 7, any counter value in the AS range can be increased or decreased a maximum of three times without hitting a discontinuous point. For example, a counter value of 12 having a delay (internal value) of 12 is in the AS (not in the FS). The counter value of 12 can be increased three times to 15, and a resulting delay (internal value) can also be increased three times to 15. However, if the counter value is increased a fourth time to 16, the resultant delay is 9, which is not an increase by a linear step. This is a discontinuous point as described elsewhere in this application. It should be noted that the filter 106 is preferably not active, nor necessary, during fine trimming (applying guard band to the chip trim solution), but is preferably only active during coarse trimming, where the chip trim solution is determined. An advantage of this embodiment is that the course trimming with the use of a filter provides trim solutions with a reasonable number of steps in an increasing or decreasing direction without hitting a point of discontinuity. For this reason, fine trimming of a chip or of a plurality of chips together can be performed without reaching a point of discontinuity.

The exemplary ranges shown in FIG. 7 provide a maximum of three linear steps for fine trimming. The width of each of the FS ranges is six. That is, each FS range includes six counter values and the corresponding six delays. Generally, the predetermined number of linear steps can be equal to half of a width of each of the ranges of predetermined forbidden chip trim solutions. Viewed in another way, the predetermined number of linear steps can be equal to half of a width of one of the ranges of predetermined forbidden chip trim solutions.

The filter 106 can receive a match signal from the phase detector 104 when the phase detector 104 has determined the counter value to be a possible chip trim solution, and the filter 106 can identify the counter value as the chip trim solution when the counter value is not within one of the forbidden ranges. The chip trim solution can be stored in the trigger circuit 108.

The trigger circuit 108 can trigger the counter 102 to increment the counter value if the counter value is masked by the filter 106 (the counter value is in the FS) or if the phase detector 104 determines that the counter value is not a possible chip trim solution. The trigger circuit 108 causes the counter value to be stored as the chip trim solution if the phase detector 104 determines that the counter value is a possible chip trim solution and the counter value of the counter 102 is not masked by the filter 106, that is, when a valid match signal for the chip trim solution is received from the filter 106. The filter 106 sends a non-valid match signal for the chip trim solution to cause the trigger circuit 108 to increment the counter value when it is equal to one of the predetermined counter values in the forbidden range (FS) or when the phase detector 104 determines that the internal delay value is less than the parameter of the external reference delay.

The trimming circuit 100 includes the counter 102 that was described above. The counter 102 can be a known counter having six bit settings. The counter 102 can output a predetermined number of signals that are a binary representation of the counter value. In the present example, the counter outputs six signals. The six signals can be connected to the six sequentially connected delay units 204, via the multiplexers 206. The counter 102 can receive the trigger signal from the trigger circuit 108 to increment the counter value when obtaining the trim solution during coarse trimming. The counter 102 can also receive a guard band increment/decrement signal (guard band signal) to increment or decrement the counter value during fine trimming that is performed after the chip trim solution is determined. The counter 102 can also receive a fuse input signal to set the counter upon power up. The trimming circuit 100 can include a read out circuit 110 for reading out the final trim solution by a test system and feeding it into a fuse converter (not shown) to permanently store the solution.

Figure 8:
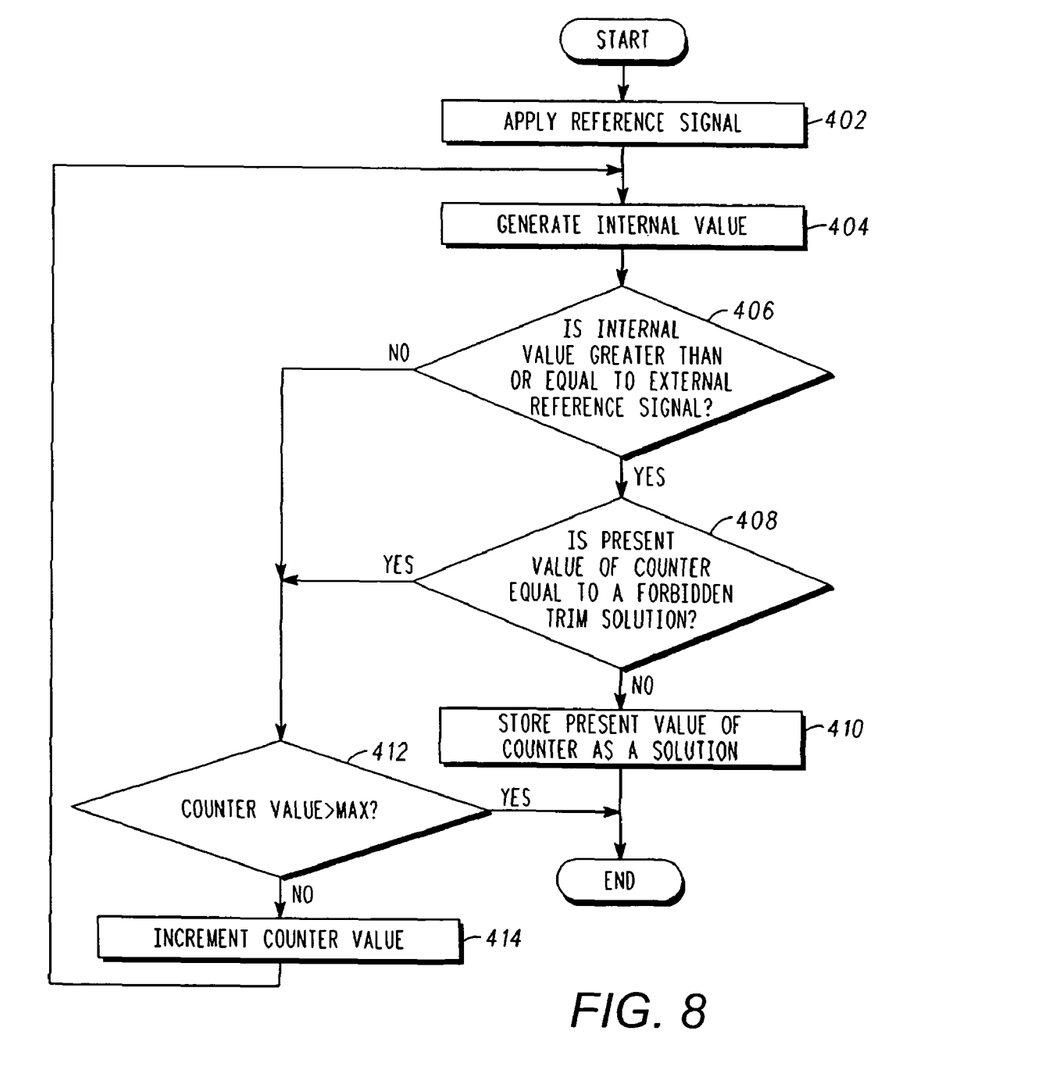
FIG. 8 is a flow diagram showing exemplary operation of the trimming circuit when performing coarse trimming to determine a chip trim solution.

Referring to FIG. 8, an exemplary methodology for performing coarse trimming to determine the trim solution for each of a plurality of chips in a test system will be discussed. After course trimming, the chips can be connected together in parallel and each of the chips includes the trimming circuit 100 discussed elsewhere in this application. Other arrangements and procedures can be used within the scope of the embodiments described in this application.

At 402, a tester applies an external reference signal to start the delay chain 202 of each chip. The external reference signal is sent to all of the chips at the same time. Optionally, an initial counter value could be chosen and sent to all of the chips. Alternatively, the counter value could be initialized to zero or the fuse states read out.

At 404, the internal delay generating circuit 200 of each of the chips generates an internal value within each of the plurality of chips. The internal value can be generated based upon the counter value of the counter 102 within each of the plurality of chips. The internal value can be particular to each of the plurality of chips. For example, each of the chips does not necessarily generate the same internal value during trimming, nor have the same counter value for course trimming (chip trim solution).

At 406, the phase detector 104 at each of the chips determines if the chip's internal value is greater than or equal to an external reference signal or, generally, a parameter of the external reference signal. For example, the pulse width of the external reference signal after being delayed can be compared to the falling edge of the external reference signal as discussed earlier. If the phase detector 104 determines that the internal value is greater than or equal to the parameter of the external reference signal (YES), the phase detector 104 can output a signal indicative of a match (match signal) to the filter 106.

At 408, after receiving the match signal from the phase detector 104, the filter 106 receives the counter value via a feedback connection with the counter 102 and determines if the counter value is within the forbidden solution ranges. For example, the filter 106 determines if the counter value is equal to one of the predetermined counter values in the forbidden ranges (FS) shown in FIG. 7. Counter values within the forbidden range will prevent using simple increment/decrement commands to increase/decrease the internal delay during fine trimming (i.e., guard band testing) and are to be avoided. Counter values that prevent the chip trim solution from being incremented or decremented a predetermined number of linear steps before hitting a discontinuous point format are predetermined and placed in the forbidden solution ranges.

If at 408 the present value of counter (counter value) is not within one of the forbidden ranges (NO), the filter 106 outputs a signal indicative of a valid match (valid match signal) to the trigger circuit 108, and at 410 the trigger circuit 108 causes the counter value to be stored as the chip trim solution.

If at 406 the result of the operation at the phase detector 104 is no match (NO) (the internal delay value is less than the external reference), or at 408, the filter 106 determines that the counter value is within the forbidden range FS (YES), the routine can proceed to 412. At 412, it is determined if the counter value is greater than a max value. If the counter value is less than the max value (NO), the routine can proceed to 414. At 414 the trigger circuit 108 triggers the counter 102 to increment the counter value. The routine then returns to 404. At 404 the incremented counter value is used to generate a different internal value. If at 412 the counter value is greater than the max value (YES), then the process ends. If at 412 the counter value becomes greater than the max value, this signifies that no trim solution has been found and the chip should be discarded.

In the present example, the maximum value would be equal to 62, as the six bit counter cannot have a value greater than 62. Therefore, in this example, if the counter value becomes equal to 63, this signifies that no trim solution has been found and that the chip should be discarded.

Figure 9:
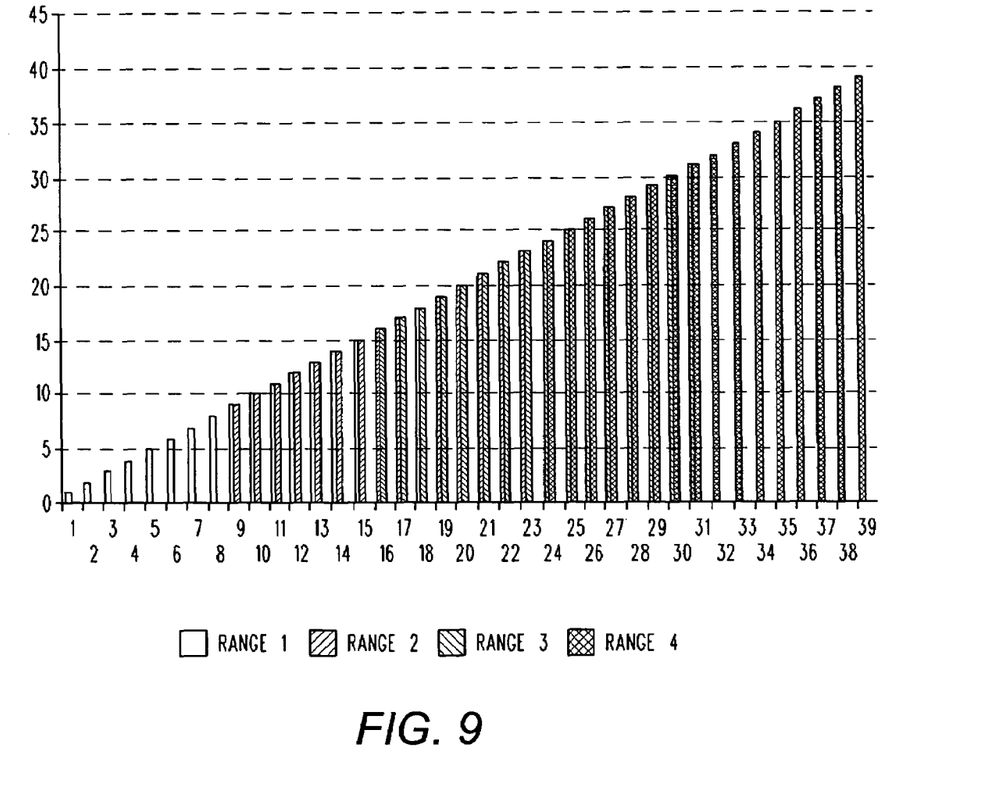
FIG. 9 is an illustration of the relationship between incremented or decremented chip trim solutions and delay during fine trimming according to the trimming circuit encompassed by the embodiments described in this application.

As shown in FIG. 9, the filter 106 filters out counter values (possible trim solutions) that are in the forbidden ranges FS during coarse trimming (determining the chip trim solution). This provides a substantially linear relationship between the incremented or decremented trim solution and delay values during fine trimming (discussed further below). That is, the counter settings can be incremented or decremented by, in the present example, three linear steps in either direction, while still obtaining a trim solution with no point of discontinuity with the previous trim solution. This feature is useful for applying the guard band test discussed later.

Further, as mentioned above, the counter 102 can output a predetermined number of signals that are a binary representation of the counter value. The predetermined number of signals can be connected to the predetermined number of sequentially connected delay units 204 via the multiplexers 206, respectively. However, the counter value need not be associated with the delay times by a binary relationship and other relationships can be used.

Rather, the counter value can have a relationship with the delay times along the lines shown in FIG. 1, in which there are overlapping ranges of delay values. For example, as shown in FIG. 7, although the counter value is a binary number, the delay time in each associated delay unit need not have a binary relationship with the counter value. For example, delay units 5 and 6 can store a delay time of 8 and 16 delay units, respectively. Therefore, a counter value of 60, for example, can result in an internal delay value of 37 delay units. The delay times stored in the delay units 204 are not limited to those shown. However, the delay times can be assigned so that the internal delay times generated have a non-binary relationship with the counter values.

Although the delay times associated with the counter values have overlapping ranges, as discussed above, the filter 106 can filter out counter values with overlapping (non-linear) ranges. This arrangement can provide a more linear relationship between the counter values (trim solutions) and delay values, as shown in FIG. 6, in comparison with the relationship, as shown in FIG. 1.

A methodology for performing a backend or guard band test on the plurality of chips, each of which has the trimming circuit 100, will be discussed, although other arrangements and procedures can be used within the scope of the embodiments described in this application. Although a chip trim solution has already been obtained, actual use of the chip during a particular application might involve different variations, such as, for example, slightly higher or lower voltage or temperature, which can affect operability. Therefore, a backend test can be used to perform fine trimming in which a guard band is applied to all of the chips in parallel to evaluate chip functionality over a critical range associated with the chip trim solution of each chip.

Prior to fine trimming, the chip trim solution for each of the plurality of chips is obtained as discussed above; and the solution is saved to a nonvolatile memory device, such as fuses, on the chip. During fine trimming, the chip trim solution of each of the plurality of chips is read and then supplied to the counter 102 by the fuses (e.g., FUSE INPUT as shown in FIG. 2). The counter value of the trim solution is incremented and/or decremented a predetermined number of times (linear steps) and internal values are respectively generated for each of the incremented and/or decremented chip trim solutions. The incrementing and/or decrementing of the counter values during fine trimming can be in response to a guard band incrementing/decrementing (GB INC/DEC) signal received by the counter 102, as would be understood by those skilled in the art. Different internal values are obtained that are increased or decreased by linear steps from the internal value generated by the trim solution of the chip, and the functioning of the chip is tested.

A response signal based upon the internal value is generated during the fine trimming, wherein the response signal is indicative of satisfying or of not satisfying a critical condition. The response signal can be selectively read from each of the plurality of chips even when they are connected to a shared data channel by, for example, using a chip individual chip select (CS) or output enable (OE) signal. For example, assuming the chips are used for a DRAM, a certain delay will be required to successfully read from or write to the DRAM. Therefore, the chips are evaluated to see if each of them can successfully read from or write to the DRAM at the counter value that generates the present internal delay value of each chip. The critical condition could be a successful write or read. The response signal could indicate whether the write or read operation was successfully performed, thereby satisfying or passing the fine trimming test.

Before fine trimming, the maximum guard band (the maximum number of times to decrease or increase the trim solution in one direction) to apply is determined for a number of chips connected in parallel. The chips each have the trimming circuit 100 where the chip trim solution was found and saved during fine trimming. The maximum guard band applied is related to the number of linear steps permitted by the forbidden ranges. For example, the forbidden ranges can include the first three counter values (i.e., 1-3), the last three counter values (i.e., 60-62) and counter values offset three units in both directions from the points of discontinuities as shown in FIG. 1. For example, in FIG. 1, the points of discontinuities are between counter values 15 and 16, counter values 30 and 31, and counter values 46 and 47. Therefore, three linear steps are permitted in either direction over the remaining counter values. Accordingly, the maximum guard band is three in the present example. In general, the maximum guard band that can be applied is half the width of the forbidden range in case of a symmetric guard banding scheme. In case of a one-sided guard banding scheme (e.g. testing for only longer delays or only for smaller delays as a critical case) the maximum guard band can be as large as the forbidden range (or solution) plus an acceptable range (or solution). Asymmetric guard banding schemes can also be employed where one side (e.g. larger or shorter delays) are more critical and should be tested with more guard band then the respective opposite end of the range. Such guard band range selection can be implemented in the filter circuit accordingly.

As long as the guard band is incremented or decremented a number of linear steps that is within the maximum guard band, the internal values will have a linear relationship with the decremented or incremented chip trim solutions. That is, all of the incremented and decremented chip trim solutions will remain in the same range. In the arrangements shown in FIGS. 7 and 9, an internal value (delay) can be incremented or decremented three times without hitting a discontinuous point, while remaining in the same range. In this example, a range can refer to each of the four regions bound by the points of discontinuity shown in FIG. 1 [e.g., (0-15), (16-30), (31-46) and (47-62)].

The range of the chip trim solution is determined by performing the coarse trimming. The fine trimming is preferably performed within the same range by incrementing or decrementing the chip trim solution by no more than the predetermined number of linear steps.

The fine trimming can be performed after the coarse trimming in which the chip trim solution is found. The fine trimming can also be performed upon powering up the chips, at which time the fuse input will be read into the counter 102 of each of the plurality of chips, as shown in FIG. 2.

Some of the advantages achieved by the trimming circuit encompassed by the embodiments described in this application will be discussed. The trimming circuit permits each of the chips to obtain a trim solution independently of the other chips. For example, the trim solution is a value particular to each chip, and generally independent of the other chips connected in parallel. Further, when the guard band is applied, each chip decrements or increments its own particular trim solution. Thereby, a test system in which many chips are connected in parallel can apply an increment or decrement command to all of the chips, without having to know the particular trim solution for each chip. Further, the filter in each of the chips prevents obtaining a chip trim solution during coarse trimming that will result in a cross of a discontinuity point during fine trimming when a decrement or increment command is applied within the maximum number of linear steps, thereby ensuring that decrementing or incrementing the guard band by one unit during fine trimming results in only a decrease or an increase in the internal value (i.e., time delay/voltage) by one resolution unit.

As shown in FIG. 9, when applying the guard band, all of the different internal delay values can have a substantially linear relationship with the counter values when the counter value is incremented or decremented within a predetermined number of linear steps as long as the guard band is applied no more than the maximum number of linear steps.

The trimming circuit 100 is not limited to finding chip trim solutions in the time domain. For example, the trimming circuit 100 may be used to obtain solutions in the voltage domain. For example, a transistor in a DRAM will require a certain amount of gate voltage to be activated that can be determined during coarse trimming. The critical condition could be if the transistor has sufficient gate voltage. Therefore, the chips could be evaluated to determine if each chip can successfully activate the transistor (voltage greater than or equal to gate potential) at the counter value that generates the present internal voltage value of each chip during coarse trimming. The response signal could indicate whether the transistor was activated. The trimming circuit 100 can be slightly modified to obtain solutions in the voltage domain, as those skilled in the art will understand. For example, the phase detector 104 could be replaced with a differential amplifier and instead of an external timing reference signal an external reference voltage can be used.

In view of the above, it will be seen that the embodiments described herein are achieved and other advantageous results attained. As various changes could be made in the above constructions without departing from the scope of the chip trim solution scheme for semiconductor memory described in this application, it is intended that all matter contained in the above descriptions or shown in the accompanying drawings shall be interpreted as illustrative and not in a limiting sense.

What is claimed is:

1. A trimming circuit for determining a trim solution, comprising:
   an internal value generating circuit to generate an internal value based upon a counter value;
   a determining circuit to compare a relationship between the internal value and an external reference signal to determine if the counter value is the trim solution, where predetermined counter values are excluded as the trim solution.

2. The trimming circuit for determining a trim solution according to claim 1, further comprising:
   a filter to mask the predetermined counter values from being the trim solution, thereby making a relationship between internal values generated by the internal value generating circuit and non-masked counter values have more linearity when compared to a relationship between internal values generated by the internal value generating circuit and all counter values.

3. The trimming circuit for determining a trim solution according to claim 2, further comprising:
   a trigger circuit to increase the counter value if the counter value is masked by the filter, and to increase the counter value if the determining circuit determines that the counter value is not the trim solution.

4. The trimming circuit for determining a trim solution according to claim 2, further comprising:
   a trigger circuit to decrease the counter value if the counter value is masked by the filter, and to decrease the counter value if the determining circuit determines that the counter value is not the trim solution.

5. The trimming circuit for determining a trim solution according to claim 2, wherein:
   the counter values are generated by a counter;
   the determining circuit includes a phase detector;
   the internal value generating circuit includes a predetermined number of sequentially connected delay units, and each of the predetermined number of sequentially connected delay units has a delay value;
   the counter outputs a predetermined number of signals that are binary representation of the counter value, the predetermined number of signals are connected to the predetermined number of sequentially connected delay units, respectively;
   the external reference signal is delayed by the delay value of each of the sequentially connected delay units based upon its respective signal from the counter, the internal value is equal to a sum of the delay of the external reference signal after passing through the sequentially connected delay units; and the counter value of the counter is associated with the delay values by a non-binary relationship.

6. The trimming circuit for determining a trim solution according to claim 2, wherein the filter provides a substantially linear relationship between counter values and the internal values generated based upon the counter values as long as a respective counter value is within a predetermined number of linear steps from the trim solution.

7. A trimming circuit for determining a trim solution, comprising:
internal value generating means for generating an internal value based upon a counter value of a counter;
determining means for determining if the counter value is a possible trim solution based upon a relationship between the internal value and an external reference signal;
adjusting means for sequentially adjusting the counter value if the determining means determines that the counter value is not the possible trim solution; and
filtering means for masking counter values within ranges of predetermined forbidden chip trim solutions from being the trim solution.

8. The trimming circuit for determining a trim solution according to claim 7, wherein:
the determining means is further for determining if the internal value is greater than or equal to a parameter of the external reference signal as the relationship between the internal value and the external reference signal;
the adjusting means is for incrementing the counter value; and
the filtering means is further for causing the adjusting means to increment the counter value if the counter value is masked, and for causing the counter value to be stored as the trim solution if the internal value is determined to be greater than or equal to the parameter of the external reference signal by the determining means and the counter value is not masked.

9. The trimming circuit for determining a trim solution according to claim 7, wherein the internal value generated by the internal value generating means has a non-binary relationship with the counter value.

10. The trimming circuit for determining a trim solution according to claim 7, wherein the filtering means is further for providing a range of substantial linearity between counter values and generated internal values as long as the counter values are within a predetermined number of linear steps from the trim solution.

11. The trimming circuit for determining a trim solution according to claim 10, wherein the predetermined number of linear steps is equal to half of a width of one of the ranges of predetermined forbidden trim solutions.

12. The trimming circuit for determining a trim solution according to claim 10, wherein a sum of the predetermined number of linear steps from a starting point to an ending point of the range of substantial linearity is equal to a width of the range of one of the predetermined forbidden solutions.

13. A method for testing a trim solution for a semiconductor device, comprising:
sequentially adjusting a counter value a predetermined number of times from a starting counter value toward an ending counter value, the starting and ending counter values being selected to provide a substantially linear relationship for internal values based on counter values from the starting counter value to the ending counter value;
generating the internal values based upon the sequentially adjusted counter values from the starting counter value toward the ending counter value; and
testing functioning of the semiconductor device at each of the generated internal values.

14. The method for testing a trim solution for a semiconductor device according to claim 13, wherein the counter value is incremented.

15. The method for testing a trim solution for a semiconductor device according to claim 13, wherein the counter value is decremented.

16. The method for testing a trim solution for a semiconductor device according to claim 13, wherein the starting counter value is selected to provide a linear relationship for the internal values based on the counter values.

17. The method for testing a trim solution for a semiconductor device according to claim 13, wherein the trim solution for the semiconductor device is obtained by the following steps:
sequentially adjusting the counter value from a second starting counter value toward a second ending counter value;
comparing each sequentially adjusted counter value to forbidden counter values, and if a match to a forbidden counter value is found, excluding the counter value from the trim solution for the semiconductor device and continuing the sequential adjustment of the counter value; and
comparing the internal value based on each sequentially adjusted counter value to an external signal value, and
if the external signal value is not matched, continuing the sequential adjustment of the counter value, and
if the external signal value is matched, storing a current counter value as the trim solution for the semiconductor device.

18. The method for testing a trim solution for a semiconductor device according to claim 17, wherein an intermediate counter value between the second starting counter value and the second ending counter value is the trim solution for the semiconductor device.

19. The method for testing a trim solution for a semiconductor device according to claim 17, wherein the trim solution for the semiconductor device is obtained by the following additional step:
comparing the sequentially adjusted counter value to the second ending counter value, and if a match to the second end counter value is found, the method is terminated and no trim solution was found is reported.

20. A method for obtaining a trim solution for a semiconductor device, comprising:
generating an internal value based upon a counter value of a counter;
adjusting the counter value when the internal value is not a forbidden solution;
adjusting the counter value when the internal value does not match a parameter of an external reference signal;
selecting a group of counter values as forbidden solutions to establish a relationship for internal values based on the counter values, the relationship including a slope of a line for the corresponding internal values between a starting counter value and an ending counter value not changing between negative and positive more than one unit; and
storing a current counter value as the trim solution for the semiconductor device when the internal value generated based upon the counter value matches a parameter of the external reference signal and when the counter value is not one of the forbidden solutions.

21. The method for obtaining a trim solution for a semiconductor device according to claim 20, wherein the counter value is sequentially incremented.

22. The method for obtaining a trim solution for a semiconductor device according to claim 20, wherein the counter value is sequentially decremented.

23. A trimming circuit, comprising:
   a filter receiving counter values, the filter masking predetermined counter values from a trim solution and providing a substantially linear relationship of internal values based on the counter values.

24. The trimming circuit according to claim 23, further comprising:
   an internal value generating circuit generating internal values based upon the counter values received from a counter and an external reference signal; and
   a determining unit determining whether each of the internal values matches a parameter of the external reference signal;
   wherein the filter stores one of the counter values as the trim solution if the determining unit determines that the internal value matches the parameter of the external reference signal.

25. The trimming circuit of claim 24, wherein the determining unit comprises a differential amplifier, the internal values are voltages and the parameter of the external reference signal is a voltage signal.

26. The trimming circuit of claim 24, further comprising:
   the internal value generating unit comprising a predetermined number of sequentially connected delay units, each of the predetermined number of sequentially connected delay units having a delay value, and the counter value of the counter being associated with the delay values in a non-binary relationship.

* * * * *